(12) United States Patent
Mochizuki et al.

(10) Patent No.: US 7,385,337 B2
(45) Date of Patent: Jun. 10, 2008

(54) MULTILAYER PIEZOELECTRIC ELEMENT

(75) Inventors: Kazuo Mochizuki, Akita (JP); Syuuzi Itoh, Akita (JP); Hiroshi Hatanaka, Akita (JP)

(73) Assignee: TDK Corporation, Tokyo (JP)

( * ) Notice: Subject to any disclaimer, the term of this patent is extended or adjusted under 35 U.S.C. 154(b) by 428 days.

(21) Appl. No.: 11/150,279

(22) Filed: Jun. 13, 2005

(65) Prior Publication Data

US 2005/0280336 A1  Dec. 22, 2005

(30) Foreign Application Priority Data

Jun. 18, 2004 (JP) ............................. 2004-181524
Oct. 28, 2004 (JP) ............................. 2004-314507
Apr. 22, 2005 (JP) ............................. 2005-125399

(51) Int. Cl.
*H01L 41/047* (2006.01)

(52) U.S. Cl. ............... 310/365; 310/363; 310/364; 310/366

(58) Field of Classification Search ......... 310/363–366
See application file for complete search history.

(56) References Cited

U.S. PATENT DOCUMENTS

| | | | | |
|---|---|---|---|---|
| 6,411,018 | B1 * | 6/2002 | Heinz | 310/363 |
| 6,522,052 | B2 * | 2/2003 | Kihara et al. | 310/366 |
| 6,765,337 | B1 * | 7/2004 | Heinz et al. | 310/328 |
| 6,794,800 | B1 * | 9/2004 | Heinz | 310/366 |
| 7,259,504 | B2 * | 8/2007 | Schurz et al. | 310/365 |
| 2001/0026114 | A1 * | 10/2001 | Takao et al. | 310/364 |
| 2005/0280336 | A1 * | 12/2005 | Mochizuki et al. | 310/366 |
| 2006/0055288 | A1 * | 3/2006 | Heinzmann et al. | 310/364 |
| 2006/0232172 | A1 * | 10/2006 | Asano et al. | 310/366 |
| 2007/0164638 | A1 * | 7/2007 | Kadotani et al. | 310/363 |
| 2007/0164639 | A1 * | 7/2007 | Ohmori et al. | 310/366 |
| 2007/0257582 | A1 * | 11/2007 | Yokoyama et al. | 310/800 |

FOREIGN PATENT DOCUMENTS

| | | |
|---|---|---|
| DE | 102 34 787 C 1 | 10/2003 |
| EP | 0 844 678 A1 | 5/1998 |
| JP | A-2000-340849 | 12/2000 |
| JP | A-2001-210884 | 8/2001 |
| JP | A-2002-171003 | 6/2002 |
| JP | A-2002-542630 | 12/2002 |
| WO | WO 00/63980 A1 | 10/2000 |
| WO | WO 00/79607 | 12/2000 |

* cited by examiner

*Primary Examiner*—Jaydi A San Martin
(74) *Attorney, Agent, or Firm*—Oliff & Berridge, PLC

(57) ABSTRACT

A multilayer piezoelectric element is provided with a multilayer body, a first external electrode on a side face of the multilayer body, and a second external electrode outside the first external electrode. The multilayer body consists of an alternate stack of a plurality of piezoelectric members and a plurality of internal electrodes. The first external electrode is electrically connected to predetermined internal electrodes. The second external electrode extends in a wave pattern along a stack direction of the multilayer body and is of flat plate shape. The first external electrode and the second external electrode are electrically and physically connected through a plurality of connections.

24 Claims, 15 Drawing Sheets

MULTILAYER PIEZOELECTRIC ELEMENT

BACKGROUND OF THE INVENTION

1. Field of the Invention

The present invention relates to a multilayer piezoelectric element.

2. Related Background Art

An example of the conventionally known multilayer piezoelectric elements is one comprised of a multilayer body consisting of an alternate stack of a plurality of piezoelectric members and a plurality of internal electrodes, and external electrodes each of which is provided on a side face of the multilayer body and electrically connected to predetermined internal electrodes. In the multilayer piezoelectric element described in Japanese Patent Application Laid-Open No. 2000-340489, the entire external electrodes are formed so as to extend in the stack direction of the multilayer body. In the multilayer piezoelectric element described in Japanese Patent Application Laid-Open No. 2001-210884, the external electrodes are mesh members made of electroconductive wires and are fixed to respective side faces of the multilayer body with an electroconductive adhesive. In the multilayer piezoelectric element described in Japanese Patent Application Laid-Open No. 2002-171003, the external electrodes are coiled elastic members.

SUMMARY OF THE INVENTION

There are, however, problems as described below, in the multilayer piezoelectric elements described in the above-cited applications.

In the multilayer piezoelectric element described in Laid-Open No. 2000-340849, the entire external electrodes extend in the stack direction of the multilayer body and thus inhibit displacement (expansion and contraction) in the stack direction of the multilayer body. As the multilayer piezoelectric element is used over long periods of time, the external electrodes can fail to bear the expansion and contraction of the multilayer body, so as to result in disconnection.

In the multilayer piezoelectric elements described in Laid-Open No. 2001-210884 and Laid-Open No. 2002-171003, the external electrodes are the mesh members or the coiled elastic members and can follow the expansion and contraction of the multilayer body. For this reason, those multilayer piezoelectric elements succeeded in suppressing the inhibition of displacement of the multilayer body and the occurrence of disconnection of the external electrodes. However, the piezoelectric elements are complex in structure, because the external electrodes are formed by adopting the members of special shape such as the mesh members or the coiled elastic members.

An object of the present invention is to provide a multilayer piezoelectric element capable of suppressing the inhibition of displacement of the multilayer body and the occurrence of disconnection of the external electrodes by a simple configuration.

A multilayer piezoelectric element according to the present invention is a multilayer piezoelectric element comprising: a multilayer body consisting of an alternate stack of a plurality of piezoelectric members and a plurality of internal electrodes; a first external electrode provided on a side face of the multilayer body and electrically connected to predetermined ones of the internal electrodes; and a second external electrode of flat plate shape provided outside the first external electrode and extending in a wave pattern along a stack direction of the multilayer body, wherein the first external electrode and the second external electrode are electrically and physically connected through a plurality of connections.

In the present invention, the second external electrode extends in the wave pattern along the stack direction of the multilayer body and is electrically and physically connected to the first external electrode through the plural of connections. This configuration provides the second external electrode with elasticity in the stack direction. For this reason, when compared with the elements wherein the entire external electrodes extend in the stack direction of the multilayer body, the present invention successfully suppresses the inhibition of displacement in the stack direction of the multilayer body and also successfully suppresses the occurrence of disconnection of the second external electrode even after long-term use of the piezoelectric element.

In the present invention, the second external electrode is electrically and physically connected to the first external electrode through the plurality of connections. This permits electric paths to the predetermined internal electrodes to be secured even in the event of occurrence of disconnection of the first external electrode provided on the side ace of the multilayer body. This prevents damage to the function of the piezoelectric element.

Furthermore, in the present invention the second external electrode is constructed by adopting the very simple member of flat plate shape extending in the wave pattern along the stack direction of the multilayer body. For this reason, the configuration of the piezoelectric element is simpler than those wherein the external electrodes are constructed by adopting the members of special shape such as the mesh members or the coiled elastic members.

The connections are preferably linearly located on the second external electrode. Furthermore, the connections are more preferably located in central areas (including approximately central regions) between adjacent top portions in the second external electrode. In these cases, the elasticity of the second external electrode is maximized in the stack direction. Furthermore, it becomes easier to connect the first external electrode to the second external electrode in production of the piezoelectric element.

The connections are preferably located in a staggered pattern on the second external electrode. Furthermore, the connections are more preferably located at top portions of the second external electrode. In these cases, the connections are spaced apart from each other. For this reason, while preventing a short circuit, the distance along the stack direction can be shortened between adjacent top portions in the second external electrode.

The second external electrode preferably extends in a rectangular wave pattern along the stack direction. This facilitates production of the second external electrode. The connections may be located at first portions along the stack direction in the second external electrode. Furthermore, the connections may be located at second portions along a direction intersecting with the stack direction in the second external electrode.

The first external electrode and the second external electrode are preferably electrically and physically connected by solder at the connections. This facilitates the connection between the first external electrode and the second external electrode in production of the piezoelectric element.

Furthermore, a solder insulating layer is preferably formed on at least one of an outside surface of the first external electrode and an inside surface of the second external electrode, except for at least portions where the connections are located. This permits the first external electrode and the second external electrode to be electrically and physically accurately connected by a predetermined amount of solder at the predetermined positions.

Preferably, the second external electrode has a plurality of projections projecting toward the first external electrode and is electrically and physically connected through the projections to the first external electrode. In this case, it is feasible to securely achieve the connection between the first external electrode and the second external electrode.

The projections may be formed by pushing portions of the second external electrode out toward the first external electrode. In another form, the projections may be formed by bending portions of the second external electrode toward the first external electrode.

Tips of the respective projections are preferably substantially located on one plane. This results in keeping the gap constant between the first external electrode and the second external electrode. This makes it feasible to more securely achieve the connection between the first external electrode and the second external electrode at each projection.

The second external electrode is preferably electrically and physically connected to the first external electrode by solder at the projections. This facilitates the connection between the first external electrode and the second external electrode in production of the piezoelectric element.

Another multilayer piezoelectric element according to the present invention is a multilayer piezoelectric element comprising: a multilayer body consisting of an alternate stack of a plurality of piezoelectric members and a plurality of internal electrodes; a first external electrode provided on a side face of the multilayer body and electrically connected to predetermined ones of the internal electrodes; and a second external electrode arranged to overlap the first external electrode and discontinuously electrically and physically connected to the first external electrode in a stack direction of the multilayer body, wherein the second external electrode comprises: first portions discontinuously arranged in the stack direction, and second portions extending in a direction intersecting with the stack direction and connecting the first portions to each other.

In the present invention, the second external electrode has the first portions and the second portions and is discontinuously electrically and physically connected to the first external electrode in the stack direction. For this reason, when compared with the elements wherein the entire external electrodes extend in the stack direction of the multilayer body, the present invention successfully suppresses the inhibition of displacement in the stack direction of the element and also successfully suppresses the occurrence of disconnection of the second external electrode even after continuous long-term driving of the multilayer piezoelectric element In the present invention, the second external electrode is discontinuously electrically and physically connected to the first external electrode, whereby electric paths to the internal electrodes can be secured even in the event of occurrence of disconnection of the first external electrode provided on the side face of the multilayer body. As a result, there occurs no damage to the function of the piezoelectric element.

Furthermore, in the present invention the second external electrode is constructed in the extremely simple configuration with the first portions and the second portions, which eliminates a need for preparing the members of special shapes such as the mesh members or the coiled elastic members. As a result, it is feasible to achieve reduction of cost and size and to facilitate the electrical connection through the first external electrode to the internal electrodes.

The second external electrode is preferably of flat plate shape. In this case, it is feasible to achieve further reduction of size.

The first portions preferably extend in the stack direction.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. The same elements, or elements with the

First Embodiment

Figure 1:
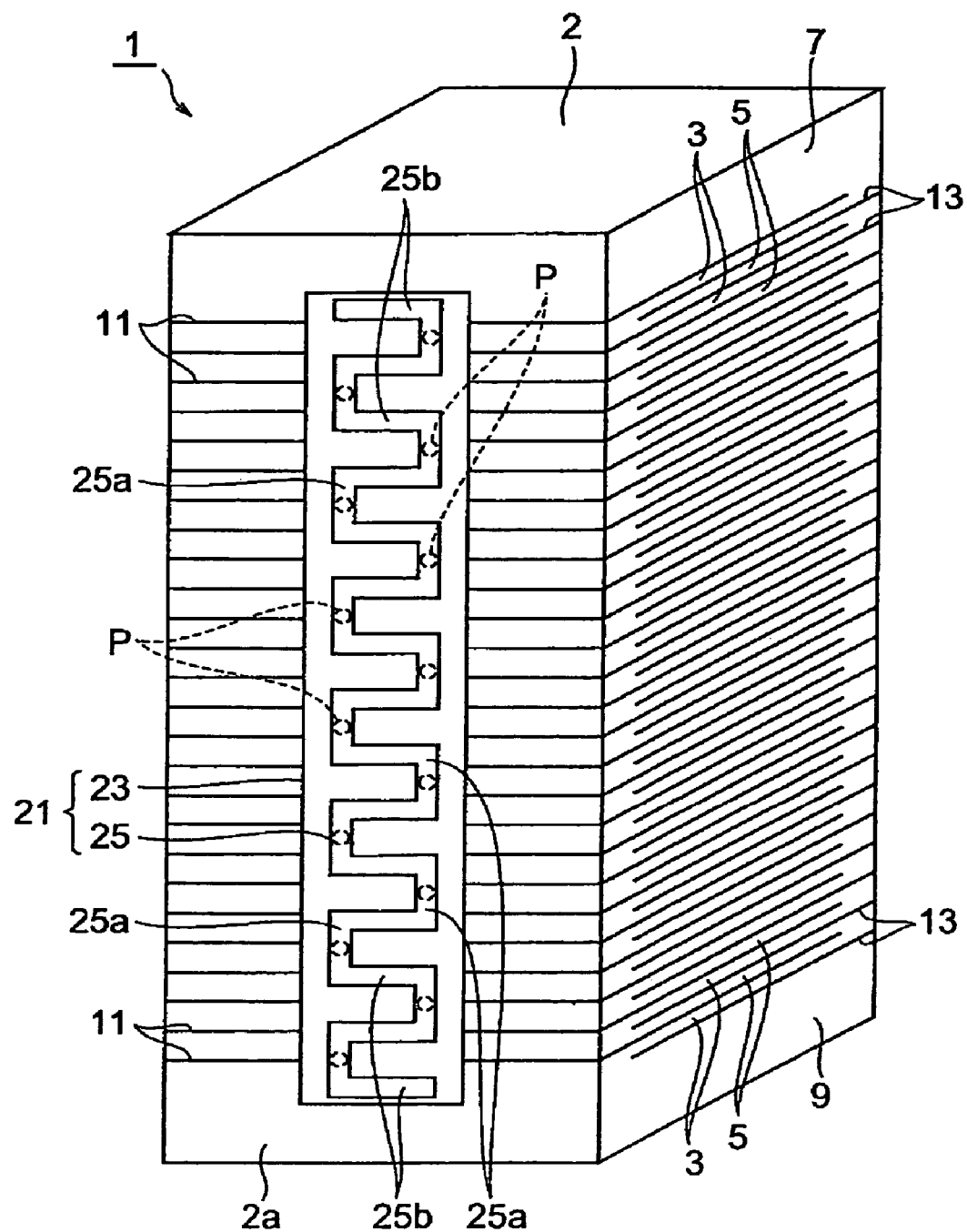
FIG. 1 is a schematic perspective view illustrating a multilayer piezoelectric element according to a first embodiment.
Figure 2:
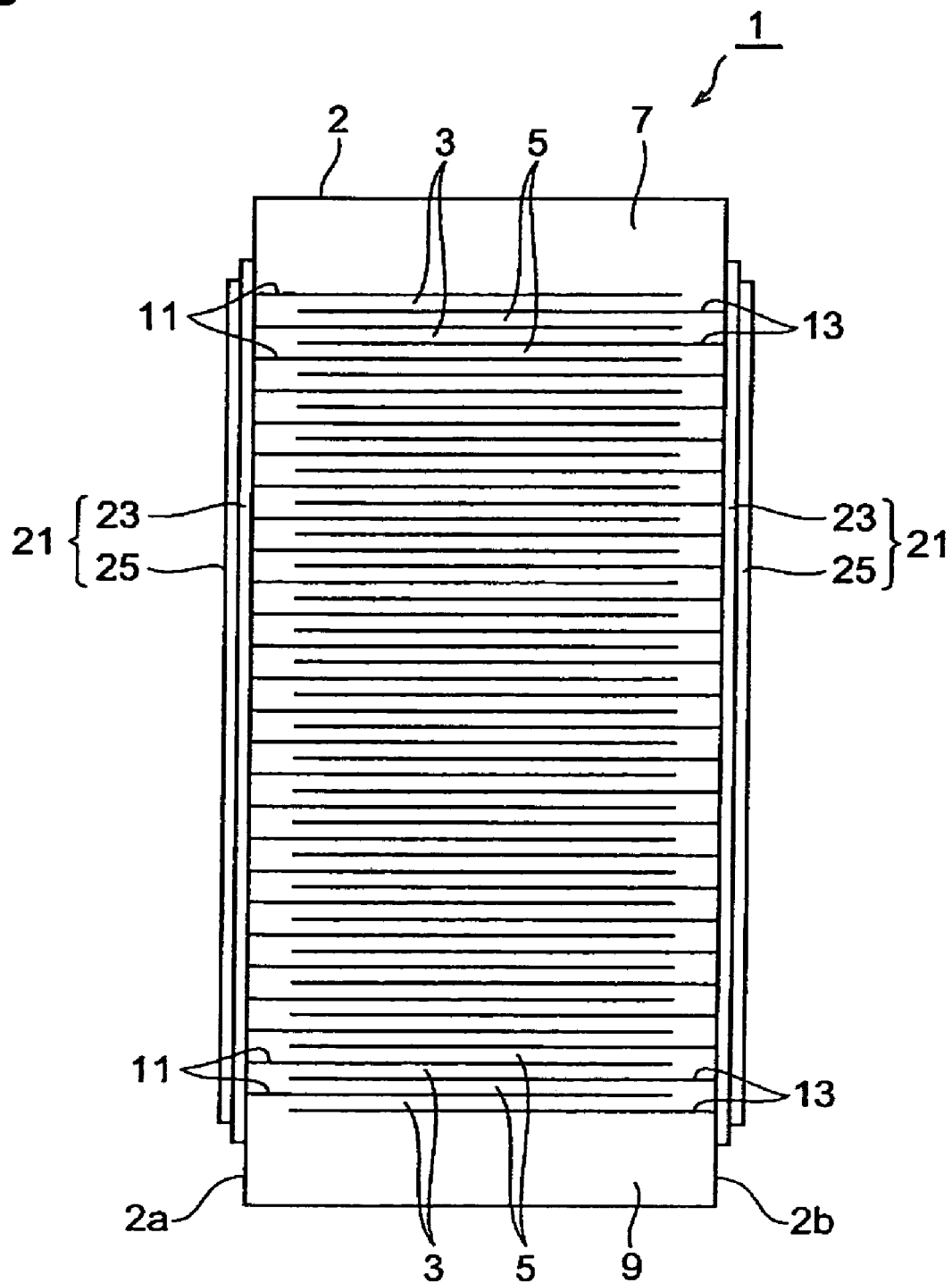
FIG. 2 is a schematic diagram for explaining a sectional configuration of the multilayer piezoelectric element illustrated in FIG. 1.

As shown in FIGS. 1 and 2, the multilayer piezoelectric element 1 of the first embodiment is provided with a multilayer body 2 of polygonal shape (quadrangular prism shape herein). The multilayer body 2 has a first side face 2a and a second side face 2b which are located in parallel with the stack direction of the multilayer body 2 (the "stack direction of multilayer body 2" will be referred to hereinafter simply as "stack direction") and opposite each other.

The multilayer body 2 is constructed in a configuration wherein piezoelectric members 3 and piezoelectric members 5 are alternately stacked and are further sandwiched between a top piezoelectric member 7 and a bottom piezoelectric member 9. Each piezoelectric member 3, 5, 7, or 9 is made of a piezoelectric ceramic material, for example, consisting primarily of lead zirconate titanate, and is formed in a rectangular thin plate shape. The thickness of each piezoelectric member 3, 5 is, for example, 50-100 μm.

The multilayer body 2 has first internal electrodes 11 and second internal electrodes 13. Each first internal electrode 11 is formed on the upper surface of piezoelectric member 3, and each second internal electrode 13 on the upper surface of piezoelectric member 5, 9. Each internal electrode 11, 13 is made of an electroconductive material, for example, consisting primarily of silver and palladium, and is formed in a pattern by screen printing. The thickness of each internal electrode 11, 13 is, for example, 0.5-5 μm.

In the multilayer body 2, the first internal electrodes 11 and the second internal electrodes 13 are stacked with the piezoelectric member 3 or 5 in between. This results in forming the multilayer body 2 in the configuration wherein the plurality of piezoelectric members 3, 5 and the plurality of internal electrodes 11, 13 are alternately stacked.

The first internal electrodes 11 are formed from the inside of the second side face 2b so as to be exposed in the first side face 2a Namely, the ends of the first internal electrodes 11 on the second side face 2b side are located a predetermined distance apart from the second side face 2b. The first internal electrodes 11 are not exposed in the second side face 2b.

The second internal electrodes 13 are formed from the inside of the first side face 2a so as to be exposed in the second side face 2b. Namely, the ends of the second internal electrodes 13 on the first side face 2a side are located a predetermined distance apart from the first side face 2a. The second internal electrodes 13 are not exposed in the first side face 2a. The second internal electrodes 13 are located so that a part thereof overlaps a part of the first internal electrodes 11 when viewed firm the stack direction.

An external electrode 21 is provided on each side face 2a, 2b of the multilayer body 2. Each external electrode 21 is constructed including a first external electrode 23 and a second external electrode 25. The first external electrode 23 is formed so as to cover a part of each side face 2a, 2b. The first external electrode 23 is made, for example, of an electroconductive material consisting primarily of silver, and is formed in a pattern by screen printing. The thickness of the first external electrode 23 is, for example, 1-40 μm.

The first external electrode 23 formed on the first side face 2a is electrically connected to the first internal electrodes 11 exposed in the first side face 2a, on the first side face 2a. The first external electrode 23 formed on the second side face 2b is electrically connected to the second internal electrodes 13 exposed in the second side face 2b, on the second side face 2b.

The second external electrode 25 is located outside each first external electrode 23 and extends in a wave pattern along the stack direction. The second external electrode 25 is made, for example, of an electroconductive material such as copper or an alloy thereof, nickel or an alloy thereof stainless steel, or beryllium copper, and is formed in a flat plate shape. The thickness of the second external electrode 25 is, for example, approximately 50-150 μm The second external electrode 25 has first portions 25a and second portions 25b. The first portions 25a extend along the stack direction and are discontinuously arranged in the stack direction. The second portions 25b extend along a direction intersecting with the stack direction (the direction perpendicular to the stack direction herein) and connect the first portions 25a to each other. In this configuration, the second external electrode 25 is arranged to extend in a rectangular wave shape (i.e., a pulse wave pattern) along the stack direction as a whole.

Figure 3:
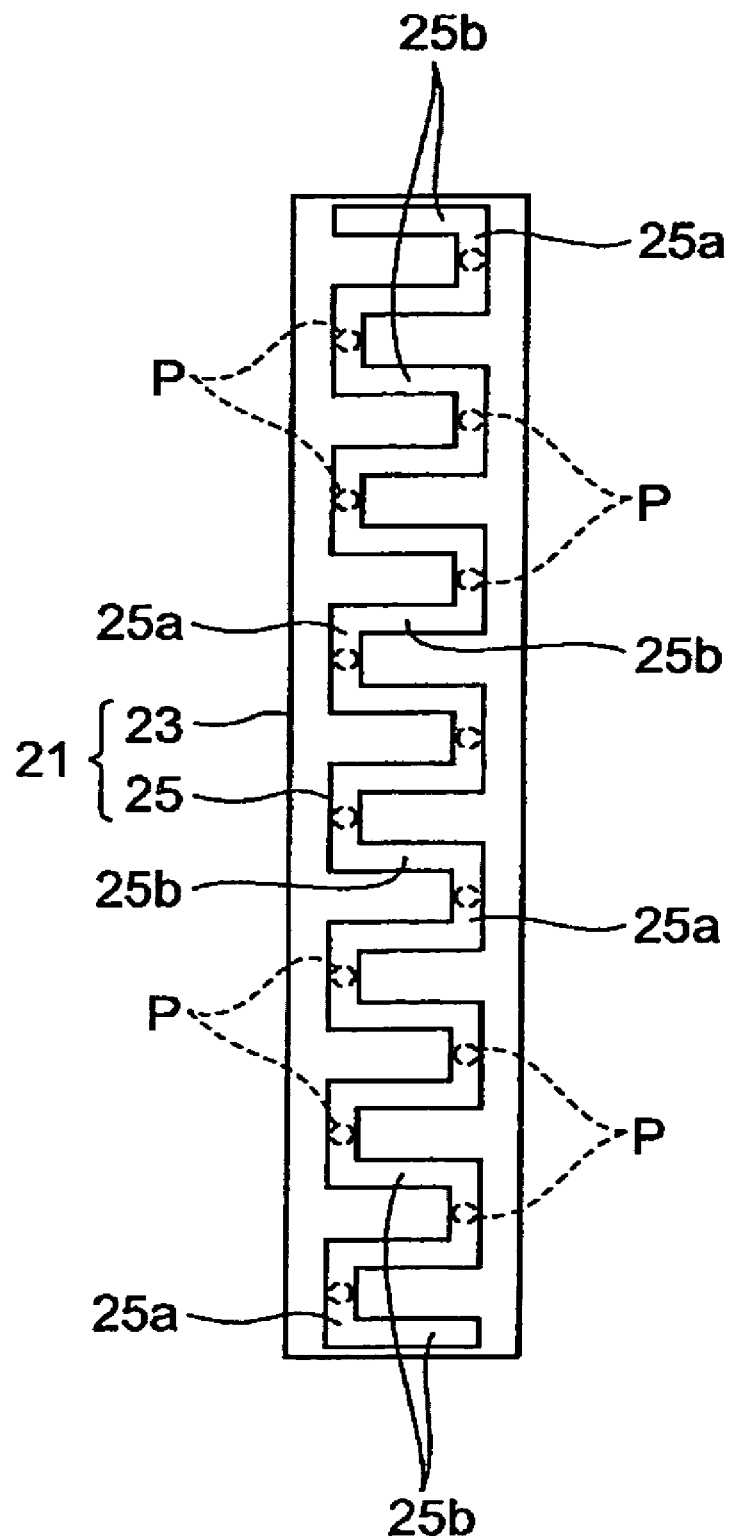
FIG. 3 is a front view of an external electrode in the multilayer piezoelectric element illustrated in FIG. 1.

The second external electrode 25, as shown in FIG. 3, is discontinuously physically (i.e., mechanically) and electrically connected to the first external electrode 23 through connections P located in the respective first portions 25a. Namely, the second external electrode 25 is discontinuously electrically and physically connected to the first external electrode 23 through the plurality of connections P located in a staggered pattern. The distance along the stack direction between adjacent connections P on the second external electrode 25 is, for example, 400-1000 μm. In a case where the second external electrode 25 extends in the rectangular wave pattern along the stack direction, the first portions 25a are top portions.

Figure 4:
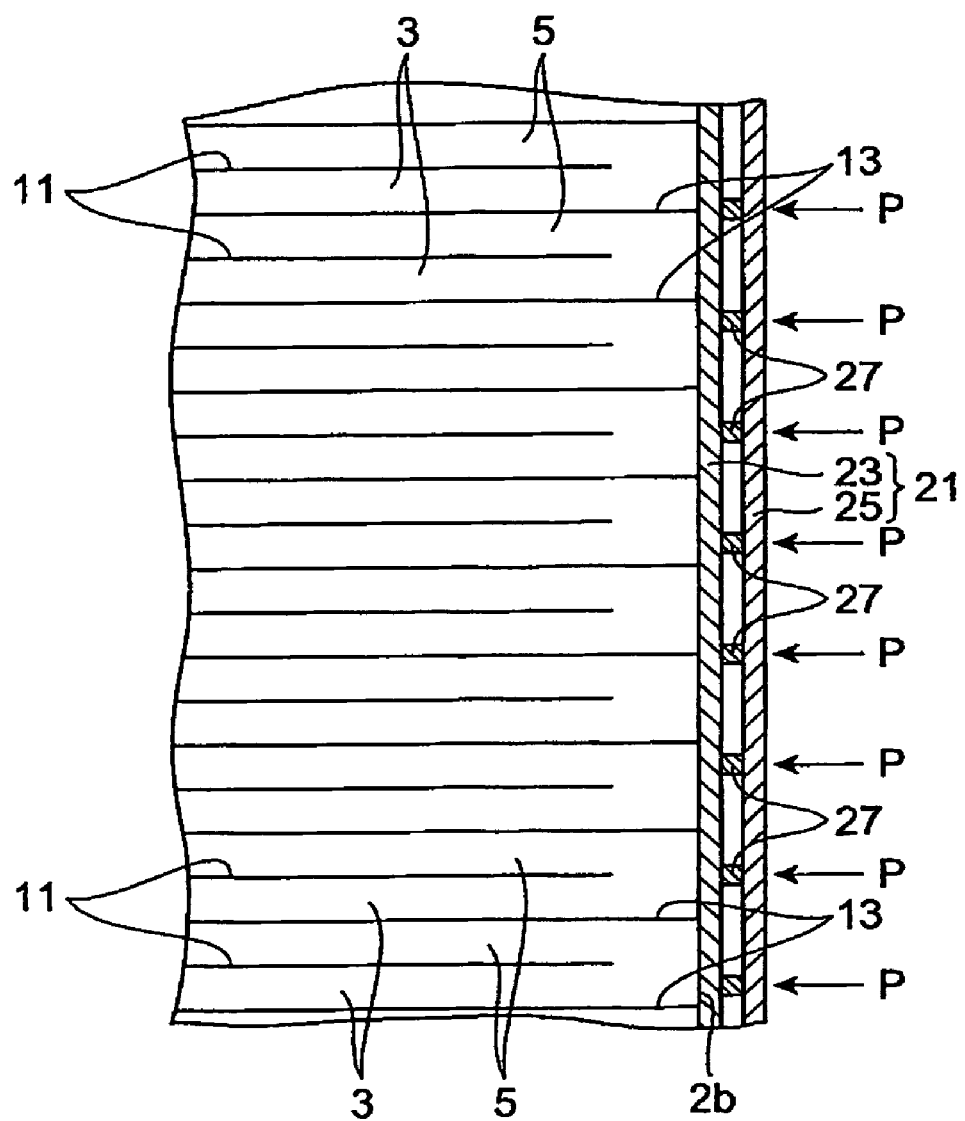
FIG. 4 is an enlarged schematic diagram for explaining a sectional configuration of the multilayer piezoelectric element illustrated in FIG. 1.

The second external electrode 25, as shown in FIG. 4, is electrically and physically connected to the first external electrode 23 by solder 27 at each connection P. The diameter of solder 27 is, for example, approximately 100-200 μm. The first external electrode 23 and the second external electrode 25 may be connected by spot welding or with an electroconductive adhesive at each connection P.

In the multilayer piezoelectric element 1 constructed as described above, when a voltage is applied between the first external electrode 23 formed on the first side face 2a and the first external electrode 23 formed on the second side face 2b, the voltage is applied between the first internal electrodes 11 and the second internal electrodes 13. This results in generating an electric field in the portions between the first internal electrodes 11 and the second internal electrodes 13, in the piezoelectric members 3, 5, and those portions are displaced as active portions.

Next, a production method of the multilayer piezoelectric element 1 of the first embodiment will be described.

First, an organic binder, an organic solvent, etc. are mixed into a piezoelectric ceramic material consisting primarily of lead zirconate titanate to prepare a substrate paste. Then green sheets for the respective piezoelectric layers 3, 5, 7, 9 are formed using the substrate paste. An organic binder, an organic solvent, etc. are mixed into a metal material consisting of silver and palladium at a predetermined ratio (e.g., silver:palladium=7:3) to prepare an electroconductive paste for formation of electrode patterns.

Subsequently, an electrode pattern corresponding to the first internal electrode 11 is formed on each of green sheets. In addition, an electrode pattern corresponding to the second internal electrode 13 is formed on each of other green sheets.

Each electrode pattern is formed by screen printing with the aforementioned electroconductive paste.

Subsequently, the green sheets with the electrode pattern corresponding to the first internal electrode 11, and the green sheets with the electrode pattern corresponding to the second internal electrode 13 are alternately stacked, and green sheets without any electrode pattern are further stacked as outermost layers thereon, thereby preparing a green laminate. The number of green sheets stacked is, for example, about 350.

Subsequently, while heating the green laminate at a predetermined temperature (e.g., about 60° C.), the green laminate is pressed in the stack direction under a predetermined pressure (e.g., about 100 MPa). Thereafter, the green laminate is cut into a predetermined size. The cutting of the green laminate is implemented, for example, with a diamond blade. This results in exposing the first internal electrodes 11 in the first side face 2a and exposing the second internal electrodes 13 in the second side face 2b.

Subsequently, the green laminate is degreased (i.e., binder removal) at a predetermined temperature (e.g., about 400° C.), and is then fired at a predetermined temperature (e.g., about 1100° C.) for a predetermined time (e.g., about two hours). This results in obtaining the multilayer body 2.

Subsequently, the first external electrode 23 is formed on each side face 2a, 2b of the multilayer body 2. The first external electrodes 23 are formed by applying an electroconductive paste consisting primarily of silver onto the multilayer body 2 by screen printing and thereafter baking the multilayer body at a predetermined temperature (e.g., about 700° C.). The first external electrodes 23 may be formed by sputtering, electroless plating, or the like.

Subsequently, the second external electrodes 25 prepared are connected to the respective first external electrodes 23 at each connection P by soldering. The second external electrodes 25 are obtained, for example, by tinning a stainless steel plate and processing it into a rectangular wave shape.

Subsequently, a polarization process (e.g., a process of applying an electric field in an environment of temperature of 120° C. for three minutes so as to achieve the intensity of 2 kV/mm) is carried out. This results in obtaining the multilayer piezoelectric element 1.

In the multilayer piezoelectric element 1 of the first embodiment, as described above, the second external electrode 25 extends in the wave pattern along the stack direction and is electrically and physically connected to the first external electrode 23 at the plurality of connections P This provides the second external electrode 25 with elasticity in the stack direction. For this reason, when compared with the elements wherein the entire external electrodes extend in the stack direction of the multilayer body, it becomes feasible to suppress the inhibition of displacement in the stack direction of the multilayer body 2 and to suppress the occurrence of disconnection of the second external electrodes 25 even after long-term use of the piezoelectric element 1.

In the multilayer piezoelectric element 1 of the first embodiment, the second external electrode 25 is electrically and physically connected to the first external electrode 23 at the plurality of connections P. This secures electric paths to the first internal electrodes 11 and electric paths to the second internal electrodes 13 even in the event of occurrence of disconnection of the first external electrode 23 formed on each side face 2a, 2b of the multilayer body 2. As a result, there arises no damage to the function of the piezoelectric element 1.

Furthermore, in the multilayer piezoelectric element 1 of the first embodiment the second external electrode 25 is constructed by adopting such an extremely simple member as the electrode of flat plate shape extending in the wave pattern along the stack direction. For this reason, the configuration of the piezoelectric element 1 can be more simplified, as compared with the elements wherein the external electrodes are constructed using the members of special shape such as the mesh members or the coiled elastic members.

Since the connections P where the first external electrode 23 and the second external electrode 25 are electrically and physically connected are located in a staggered pattern in the respective first portions 25a of the second external electrode 25, the connections P are spaced apart from each other. Accordingly, while preventing a short circuit, the distance can be shortened along the stack direction between adjacent first portions 25a in the second external electrode 25.

The second external electrode 25 is the member extending in the rectangular wave pattern along the stack direction. This facilitates the production of the second external electrode 25.

The first external electrode 23 and the second external electrode 25 are electrically and physically connected by solder 27 at the connections P. This facilitates the connection between the first external electrode 23 and the second external electrode 25 in production of the piezoelectric element 1.

Figure 5:
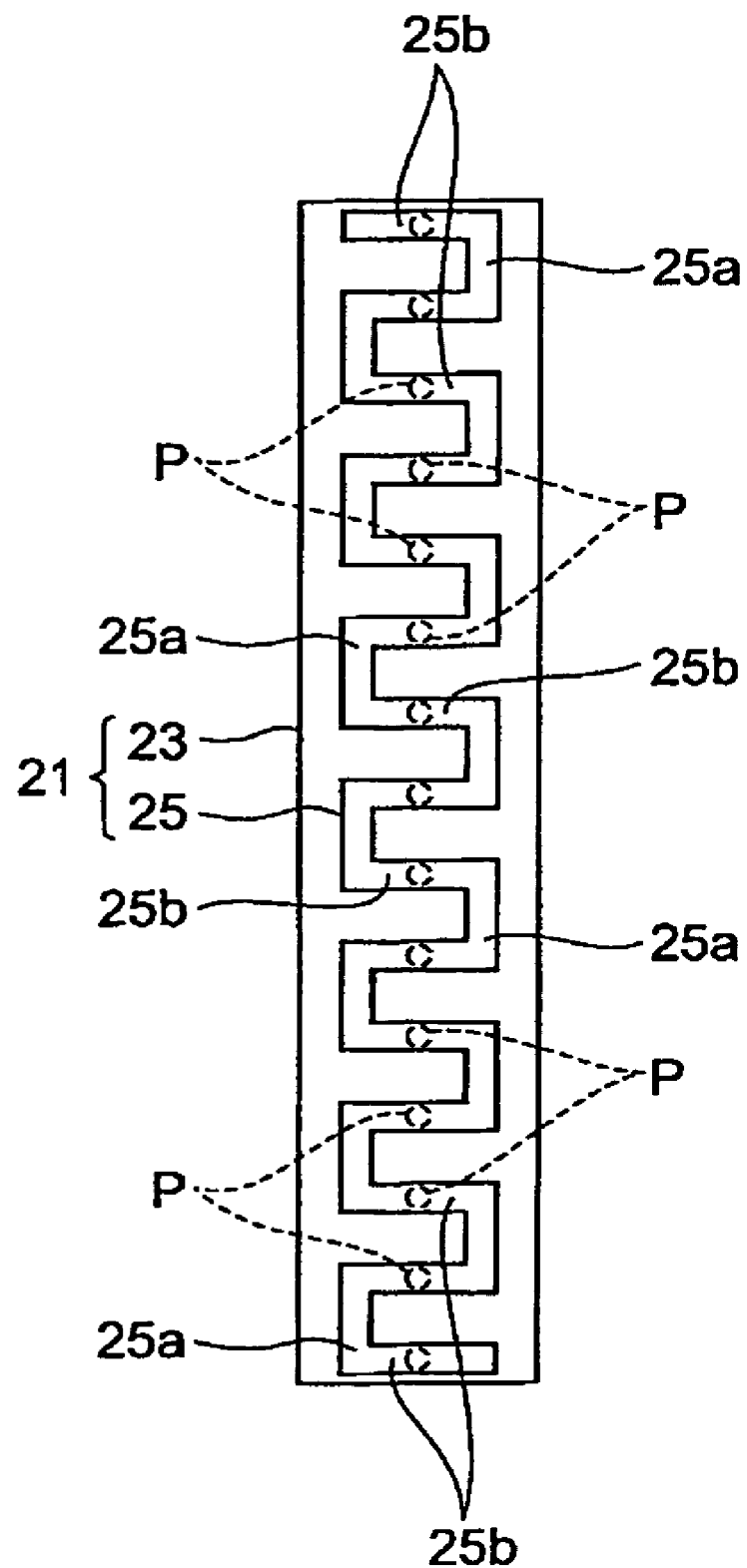
FIG. 5 is a front view illustrating a modification example of the external electrode.

The connections P, as shown in FIG. 5, may be linearly located in central portion between adjacent first portions 25a in the second external electrode 25 (i.e., in central regions of the respective second portions 25b). As the connections P are located in this manner, the elasticity of the second external electrode 25 is maximized in the stack direction. Furthermore, it facilitates the connection between the first external electrode 23 and the second external electrode 25 in production of the piezoelectric element 1.

Since the second external electrode 25 is of flat plate shape, it is feasible to achieve further reduction of size.

The distance along the stack direction between adjacent connections P is preferably set to 400-1000 µm as described above. If the distance between connections P is smaller than the above set range, the effect of suppressing the inhibition of displacement in the stack direction will be weakened. If the distance between connections P is larger than the above set range, it will be difficult to secure electric paths to the internal electrodes 11, 13.

Second Embodiment

The multilayer piezoelectric element 1 of the second embodiment is different from the multilayer piezoelectric element 1 of the first embodiment described above, in that a resist is laid on the outside surface of the first external electrode 23 and on the inside surface of the second external electrode 25. The multilayer piezoelectric element 1 of the second embodiment will be described below with focus on the difference.

Figure 6:
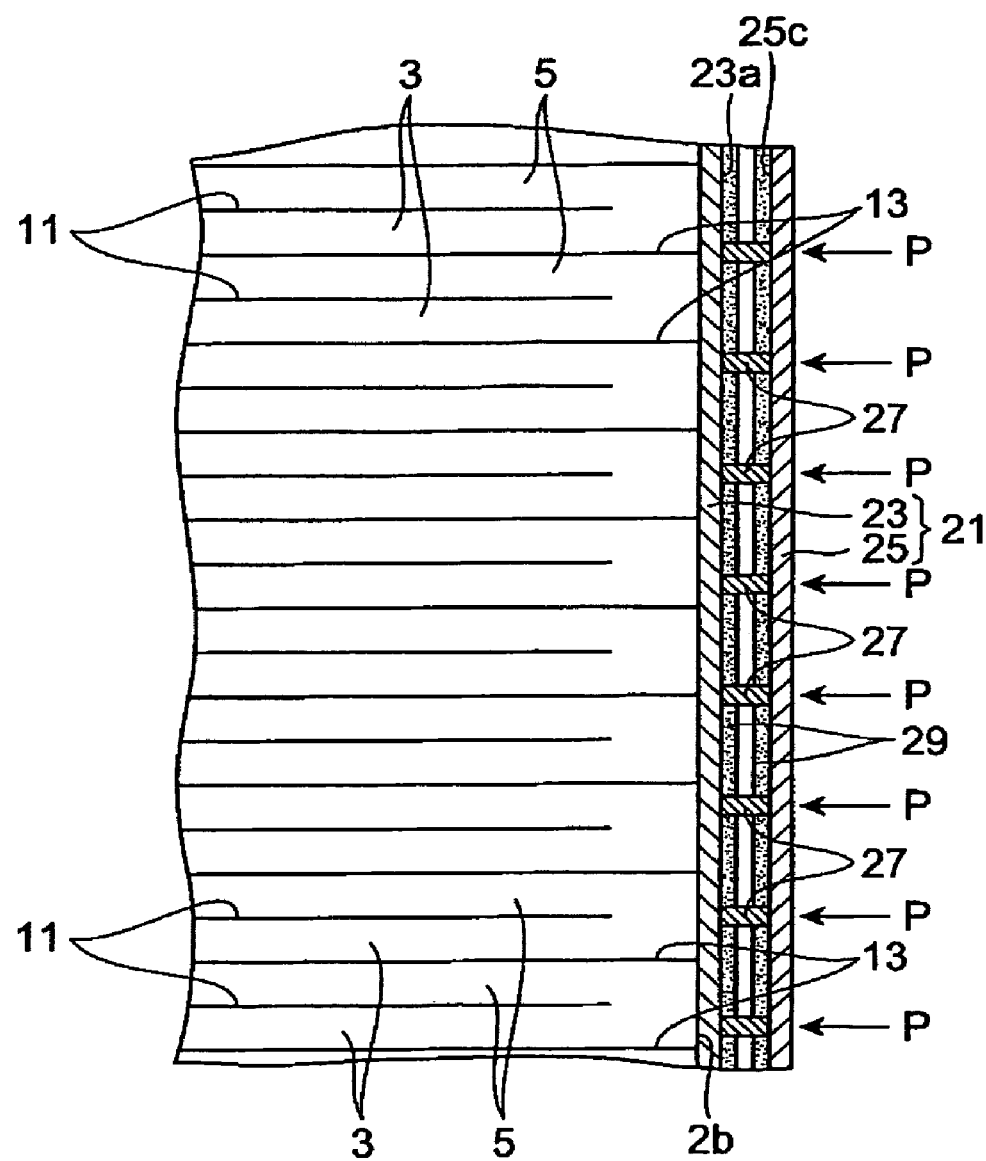
FIG. 6 is an enlarged schematic diagram for explaining a sectional configuration of a multilayer piezoelectric element according to a second embodiment.

As shown in FIG. 6, a resist (solder insulating layer) 29 is formed in a film shape on the outside surface 23a of the first external electrode 23, except for at least the regions where the connections P are located (i.e., the regions where the solder 27 is located). A resist 29 is formed in a film shape on the inside surface 25c of the second external electrode 25, except for at least the regions where the connections P are located (i.e., the regions where the solder 27 is located). The first external electrode 23 and the second external electrode 25 are electrically and physically connected by solder 27 at each connection P. The resist 29 is, for example, an epoxy resist or an acrylic resist.

Next, a production method of the multilayer piezoelectric element 1 of the second embodiment will be described. However, since the production steps up to the formation of the multilayer body 2 are similar to those for the multilayer piezoelectric element 1 of the first embodiment, the production steps subsequent thereto will be described.

The first external electrode 23 is formed on each side face 2a, 2b of the multilayer body 2 prepared. The first external electrodes 23 are formed by applying an electroconductive paste consisting primarily of silver onto the multilayer body 2 by screen printing and thereafter baking it at a predetermined temperature (e.g., about 700° C.). Thereafter, the resist 29 is formed on the outside surface 23a of each first external electrode 23, except for at least the regions where the connections P are located.

On the other hand, the second external electrodes 25 are formed by tinning a plate material of copper or an alloy thereof, nickel or an alloy thereof, stainless steel, beryllium copper, or the like and processing it into a rectangular wave shape. Then the resist 29 is formed on the inside surface 25c of each second external electrode 25, except for at least the regions where the connections P are located.

Subsequently, a solder paste is applied onto the regions where the connections P are located on the outside surface 23a of each first external electrode 23, by filling screen printing with a metal mask.

Subsequently, position alignment is achieved between each first external electrode 23 and second external electrode 25 so that all the regions where the connections P are located on the outside surface 23a of the first external electrode 23 are coincident with the corresponding regions where the connections P are located on the inside surface 25c of the second external electrode 25. Then the solder is heated to melt with a hot plate or the like from the outside of the second external electrode 25, so that the first external electrode 23 and the second external electrode 25 are electrically and physically connected by solder 27 at each connection P.

Subsequently, a polarization process (e.g., a process of applying an electric field in an environment of temperature of 120° C. for three minutes so as to achieve the intensity of 2 kV/mm) is carried out. This results in obtaining the multilayer piezoelectric element 1.

In the multilayer piezoelectric element 1 of the second embodiment, as described above, the resist 29 is formed on the outside surface 23a of the first external electrode 23 and on the inside surface 25c of the second external electrode 25, except for at least the regions where the connections P are located. This enables the first external electrode 23 and the second external electrode 25 to be electrically and physically accurately connected by the predetermined amount of solder 27 at the predetermined positions. When a tin-lead plating process is preliminarily effected in a predetermined thickness on the solder connection portions on the second external electrode 25, the solder can be used at the connections as it is.

The resist 29 may be formed on either one of the outside surface 23a of the first external electrode 23 and the inside surface 25c of the second external electrode 25. In this case, when compared with the case where the resist 29 is formed on neither of the surfaces, the first external electrode 23 and the second external electrode 25 can be electrically and physically accurately connected by the predetermined amount of solder 27 at the predetermined positions.

Figure 7:
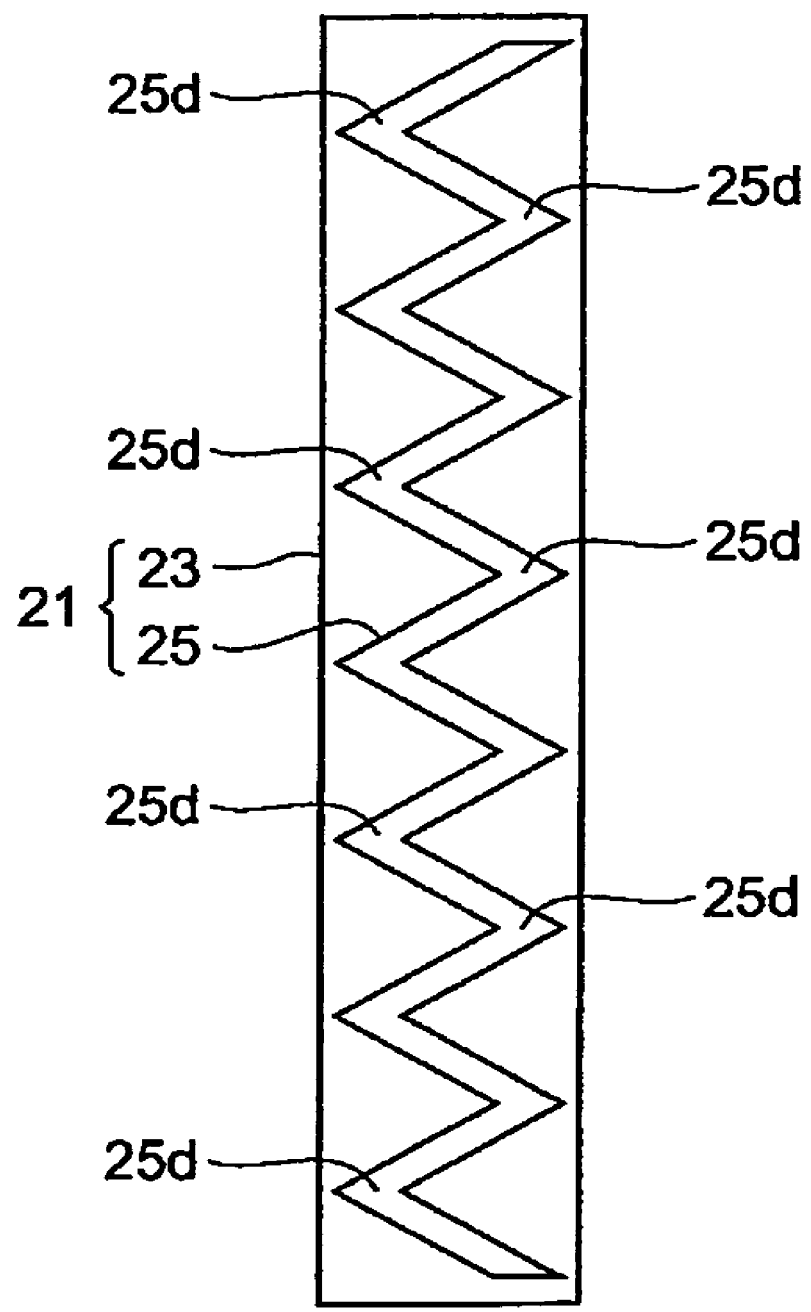
FIG. 7 is a front view illustrating a modification example of the external electrode.
Figure 8:
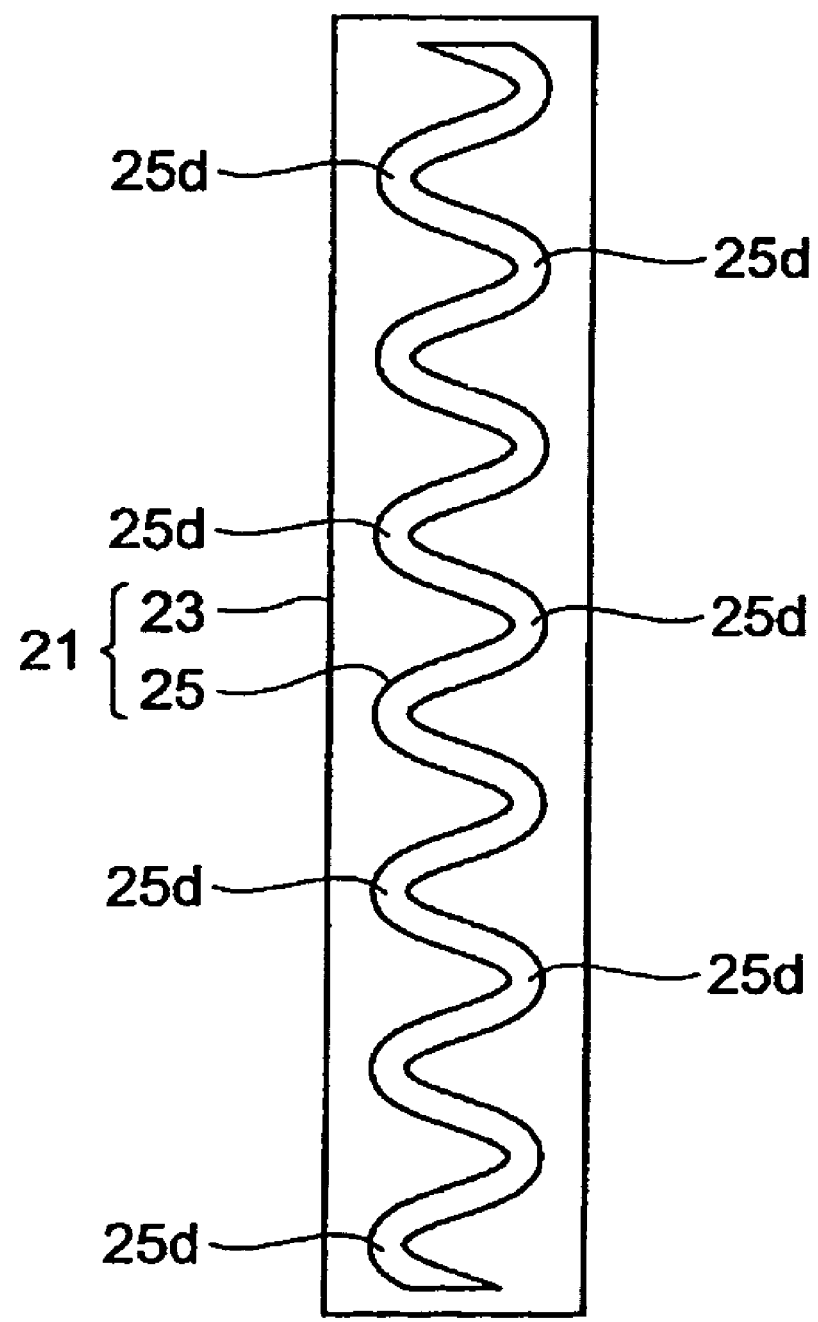
FIG. 8 is a front view illustrating a further modification example of the external electrode.

The second external electrode 25 is not limited to that extending in the rectangular wave pattern along the stack direction. As shown in FIG. 7, the second external electrode 25 may be one extending in a triangular wave pattern along the stack direction. As shown in FIG. 8, the second external electrode 25 may be one extending in a sinusoidal wave pattern along the stack direction. In these cases, the top portions are extreme portions 25d where the width of the second external electrode 25 is maximum in the direction perpendicular to the stack direction.

Third Embodiment

The multilayer piezoelectric element 1 of the third embodiment is different in the configuration of the second external electrode 25 from the multilayer piezoelectric element 1 of the first embodiment described above. The multilayer piezoelectric element 1 of the third embodiment will be described below with focus on the difference.

Figure 9:
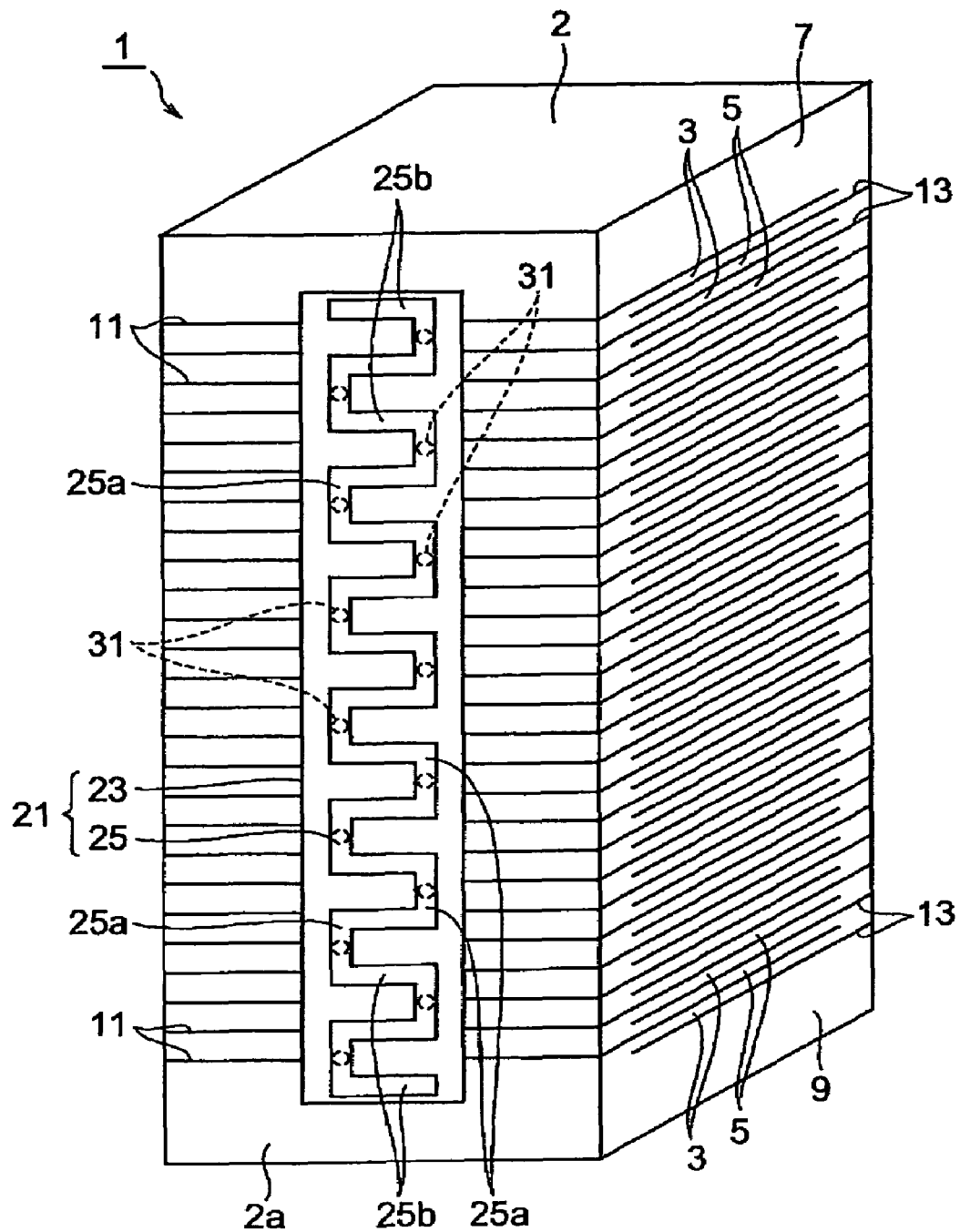
FIG. 9 is a schematic perspective view illustrating a multilayer piezoelectric element according to a third embodiment.
Figure 10:
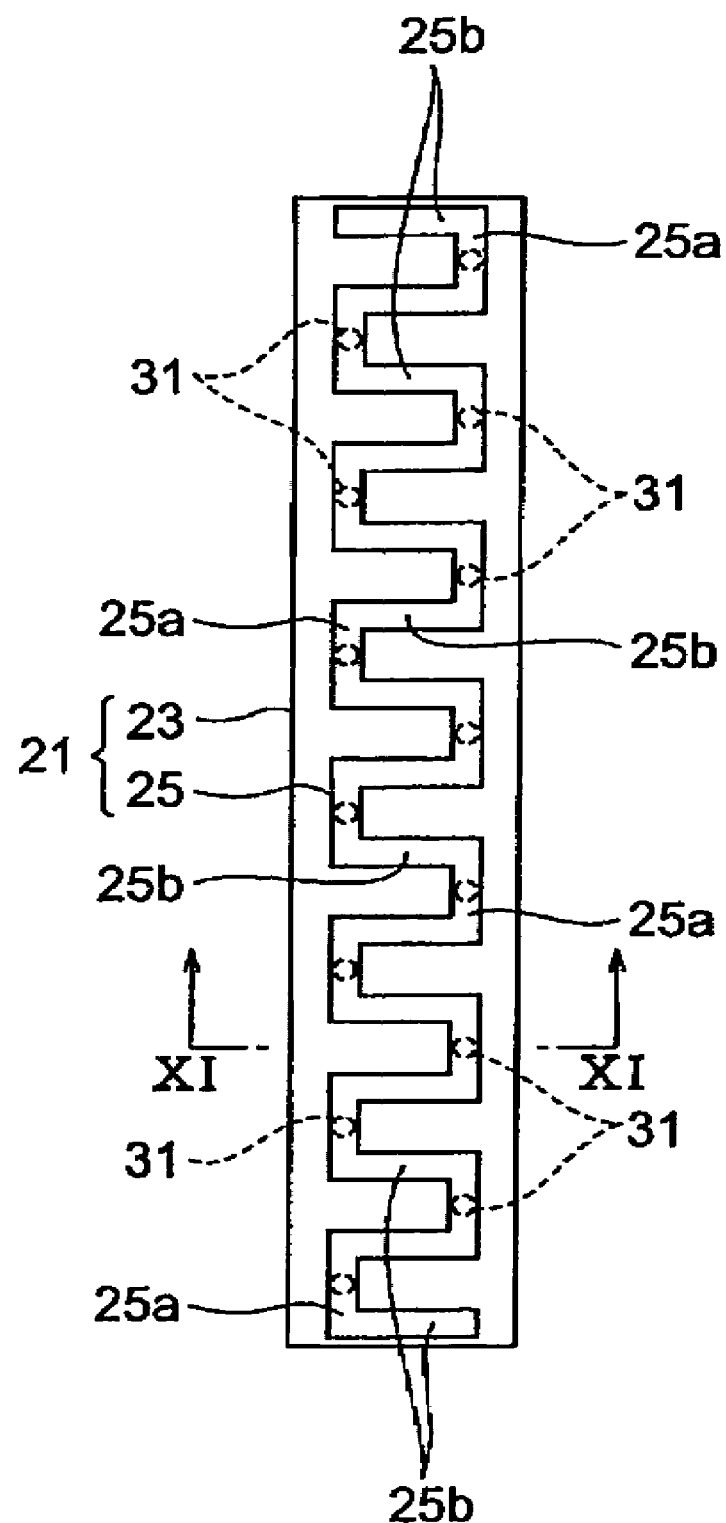
FIG. 10 is a front view of an external electrode in the multilayer piezoelectric element illustrated in FIG. 9.

Each second external electrodes 25, as shown in FIGS. 9 and 10, have projections 31 projecting toward the first external electrode 23, in the respective first portions 25a. The second external electrode 25 is discontinuously physically (i.e., mechanically) and electrically connected to the first external electrode 23 at the projections 31. Namely, the second external electrode 25 is discontinuously electrically and physically connected to the first external electrode 23 at the plurality of projections 31 arranged in a staggered pattern. The distance along the stack direction between adjacent projections 31 on the second external electrode 25 is, for example, 400-1000 μm.

Figure 11:
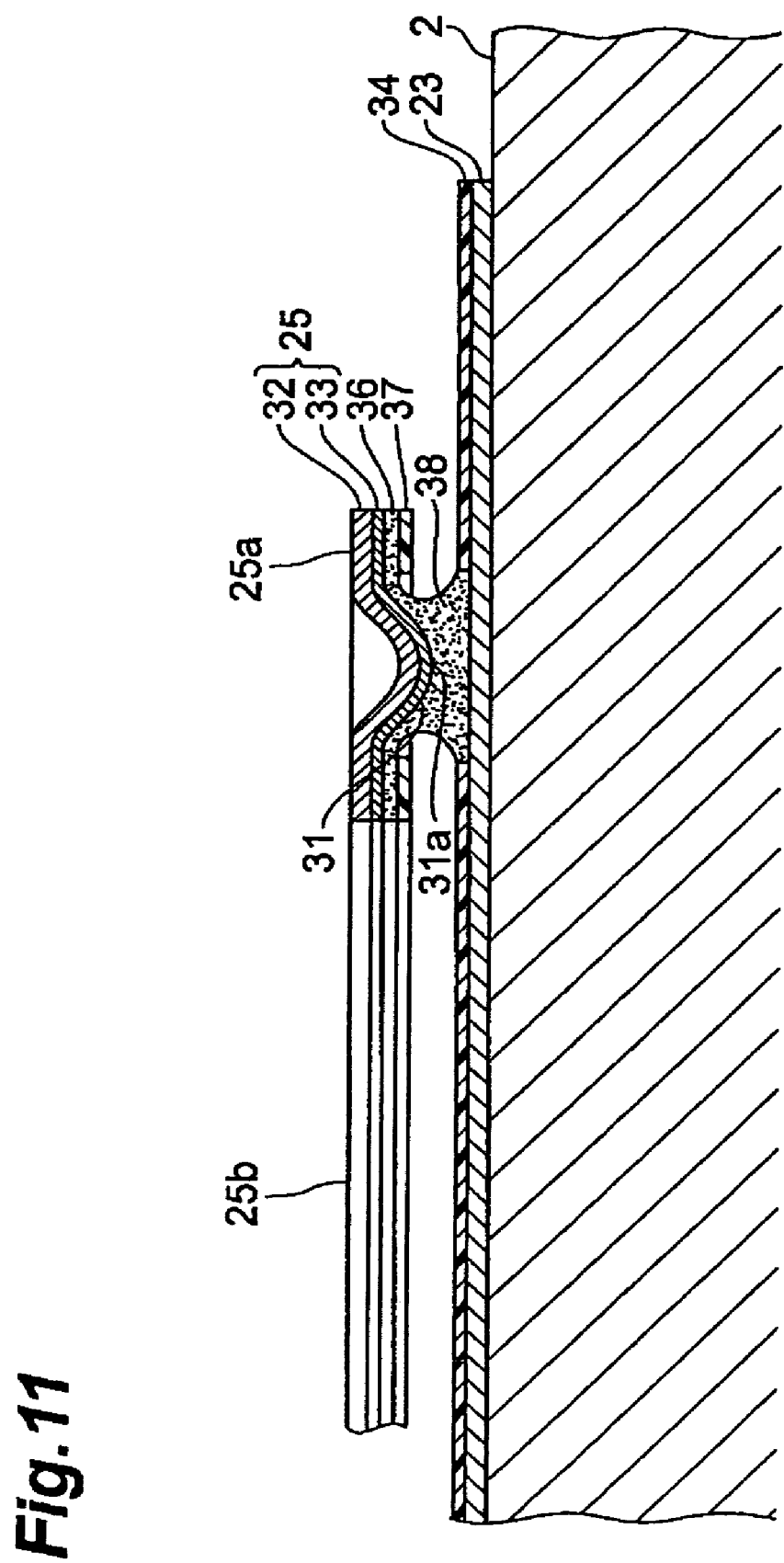
FIG. 11 is a partial sectional view along line XI-XI illustrated in FIG. 10.

As shown in FIG. 11, the second external electrode 25 has a metal plate 32, and a tin-plated layer 33 provided on the inside surface of the metal plate 32. The second external electrode 25 is constructed in a flat plate shape. The metal plate 32 is made, for example, of an electroconductive material such as copper or an alloy thereof, nickel or an alloy thereof, stainless steel, or beryllium copper. The thickness of the metal plate 32 is, for example, about 50-150 μm. The projections 31 are formed by pushing a part of each first portion 25a in the second external electrode 25 out toward the first external electrode 23. The tips 31a of the respective projections 31 are substantially located on the same plane.

A solder layer 38 is provided in a region opposite to each projection 31 in the second external electrode 25, on the outside surface of the first external electrode 23. A resist layer 34 is provided in the region except for the solder layers 38. A tin-lead plated layer 36 is provided on the inside surface of the tin-plated layer 33 of the second external electrode 25. A resist layer 37 is provided on the inside surface of the tin-lead plated layer 36 except for the region where the projection 31 is formed. The resist layers 34, 37 are made, for example, of an epoxy or acrylic resin.

The first external electrode 23 and the second external electrode 25 are soldered by reflow in a state in which the solder layer 38 and the tin-lead plated layer 36 butt against each other at each projection 31 of the second external electrode 25. This results in electrically and physically connecting the second external electrode 25 to the first external electrode 23 by solder at each projection 31.

By provision of the resist layers 34, 37, it is feasible to prevent outflow of the solder melted on the occasion of reflow. This enables the first external electrode 23 and the second external electrode 25 to be securely connected by the solder at each projection 31. Even if either one or both of the resist layers 34, 37 are absent, the first external electrode 23 and the second external electrode 25 can be adequately connected by the solder at each projection 31.

Figure 12:
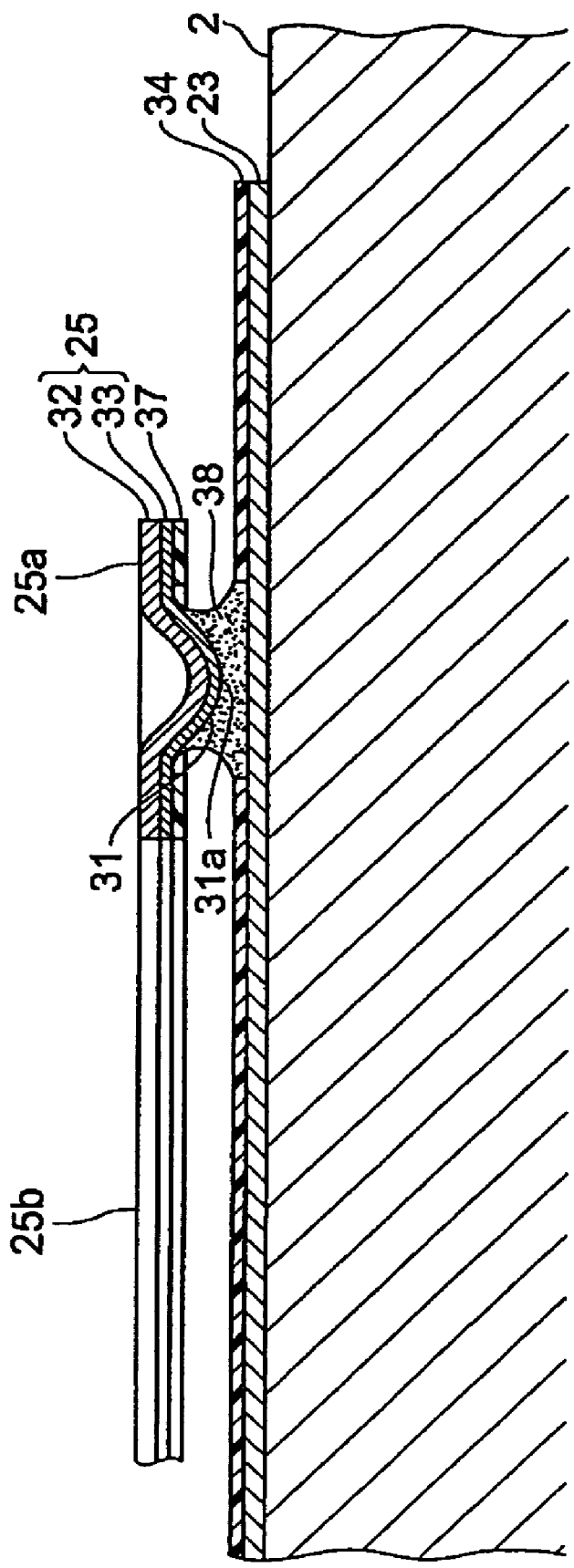
FIG. 12 is a partial sectional view illustrating a modification example of the external electrode.

As shown in FIG. 12, the tin-lead plated layer 36 can be omitted on the inside surface of the tin-plated layer 33 of the second external electrode 25. Even in this case, the first external electrode 23 and the second external electrode 25 can also be adequately connected by the solder at each projection 31. Instead of the solder layer 38 and the tin-lead plated layer 36, the first external electrode 23 and the second external electrode 25 may be connected with an electroconductive adhesive or the like at each projection 31.

Next, a production method of the multilayer piezoelectric element 1 of the third embodiment will be described. However, the production steps up to the formation of the multilayer body 2 are similar to those for the multilayer piezoelectric element 1 of the first embodiment, and, therefore, the production steps thereafter will be described below.

The first external electrode 23 is formed on each side face 2a, 2b of the multilayer body 2 prepared. The first external electrode 23 is formed by applying an electroconductive paste consisting primarily of silver onto the multilayer body 2 by screen printing and then baking it at a predetermined temperature (e.g., about 700° C.). Thereafter, the solder layers 38 and resist layer 34 are formed on the first external electrode 23.

Subsequently, the tin-lead plated layer 36 and resist layer 37 are provided on the second external electrode 25 prepared. Thereafter, the second external electrode 25 is soldered to the first external electrode 23 by reflow in a state in which the solder layer 38 and the tin-lead plated layer 36 butt against each other at each projection 31 of the second external electrode 25.

Since the first external electrode 23 and the second external electrode 25 are connected at the projections 31 in this manner, the contact area can be small between the first external electrode 23 and the second external electrode 25. Since the first external electrode 23 and the second external electrode 25 can be soldered by reflow, there is no need for pushing the second external electrode 25 against the first external electrode 23 at a large pressure during the soldering. For this reason, it is feasible to improve productivity of the multilayer piezoelectric element 1.

Subsequently, a polarization process (e.g., a process of applying an electric field in an environment of temperature of 120° C. for three minutes so as to achieve the intensity of 2 kV/mm) is carried out. This results in obtaining the multilayer piezoelectric element 1.

In the multilayer piezoelectric element 1 of the third embodiment, as described above, the second external electrode 25 extends in the wave pattern along the stack direction and is electrically and physically connected to the first external electrode 23 at the plurality of projections 31. This provides the second external electrode 25 with elasticity in the stack direction. For this reason, when compared with the elements where the entire external electrodes extend in the stack direction of the multilayer body, it is feasible to suppress the inhibition of displacement in the stack direction of the multilayer body 2 and to suppress the occurrence of disconnection of the second external electrode 25 even after long-term use of the piezoelectric element 1.

The second external electrode 25 is electrically and physically connected to the first external electrode 23 at the plurality of projections 31 projecting toward the first external electrode 23 so that the tips 31a are substantially located on the same plane. For this reason, the gap is readily kept constant between the first external electrode 23 and the second external electrode 25. As a result, it becomes feasible to securely achieve the connection between the first external electrode 23 and the second external electrode 25.

The second external electrode 25 is electrically and physically connected to the first external electrode 23 by solder at each projection 31. This can facilitate the connection between the first external electrode 23 and the second external electrode 25 in production of the piezoelectric element 1.

Figure 13:
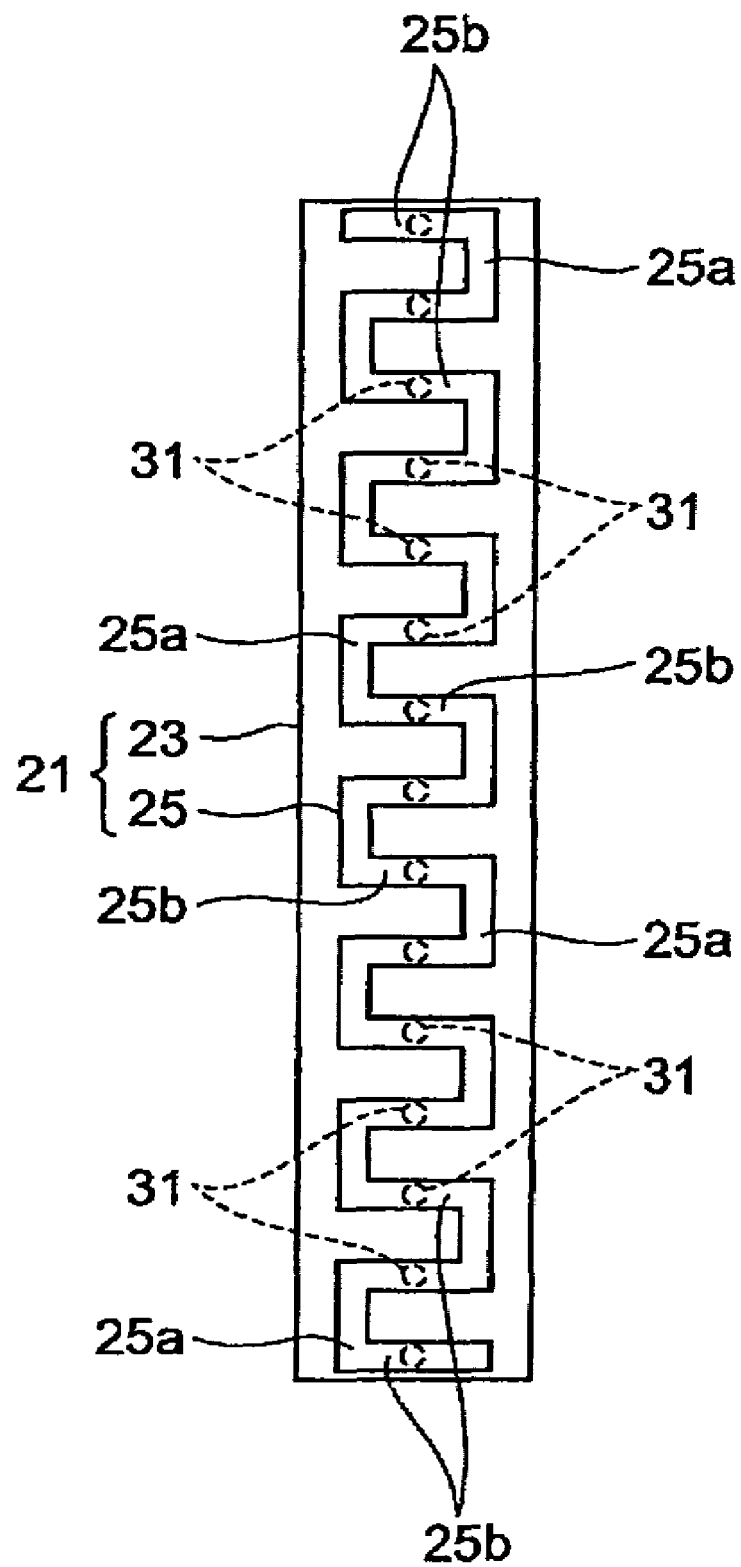
FIG. 13 is a front view illustrating a further modification example of the external electrode.

The projections 31, as shown in FIG. 13, may be linearly arranged so that the projections 31 are located in central portions between adjacent first portions 25a in the second external electrode 25 (i.e., in central portions of the respective second portions 25b).

Fourth Embodiment

The multilayer piezoelectric element 1 of the fourth embodiment is different from the multilayer piezoelectric element 1 of the third embodiment in that the projections 31 are formed by bending parts of the second external electrode 25. The multilayer piezoelectric element 1 of the fourth embodiment will be described below with focus on the difference.

Figure 14:
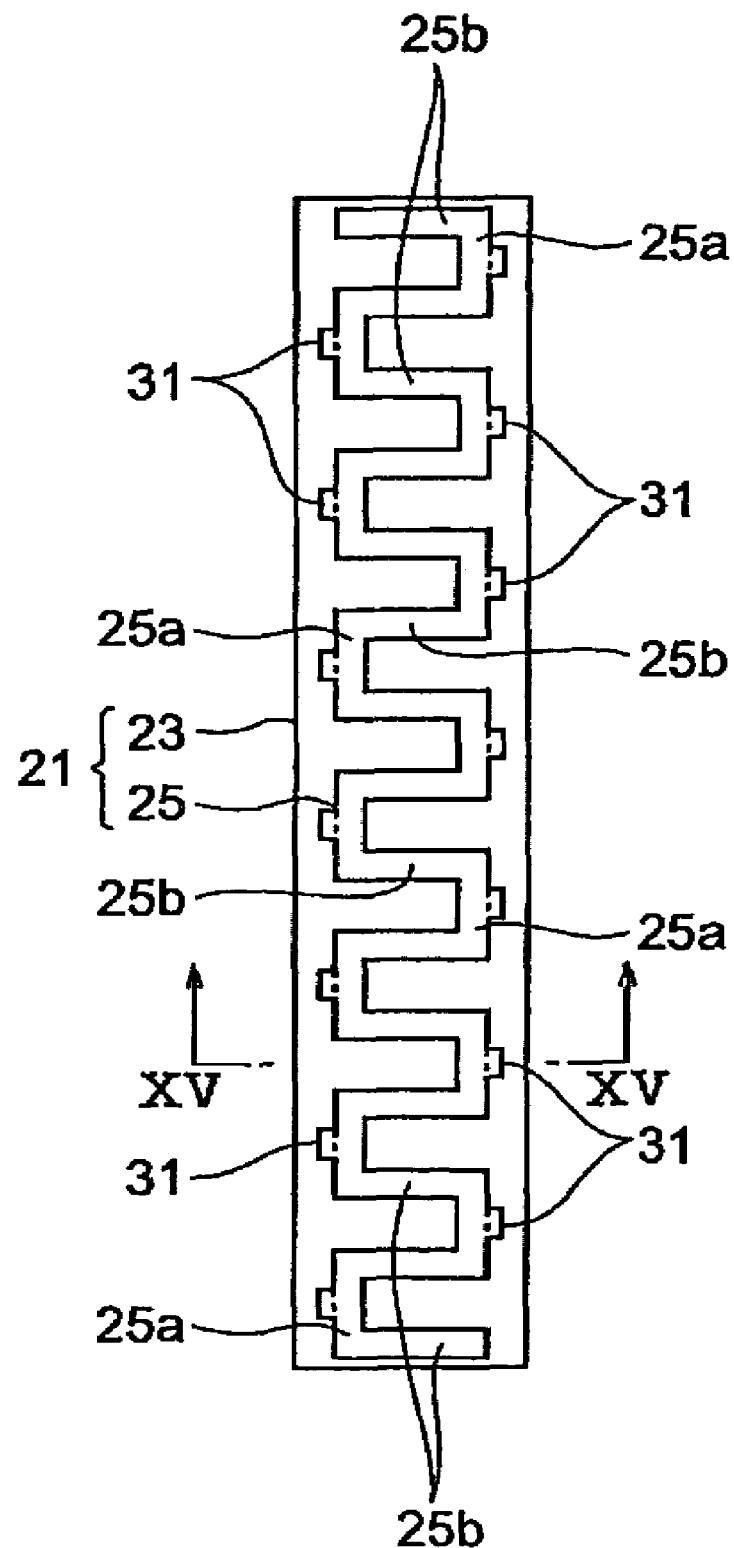
FIG. 14 is a front view of an external electrode in a multilayer piezoelectric element according to a fourth embodiment.
Figure 15:
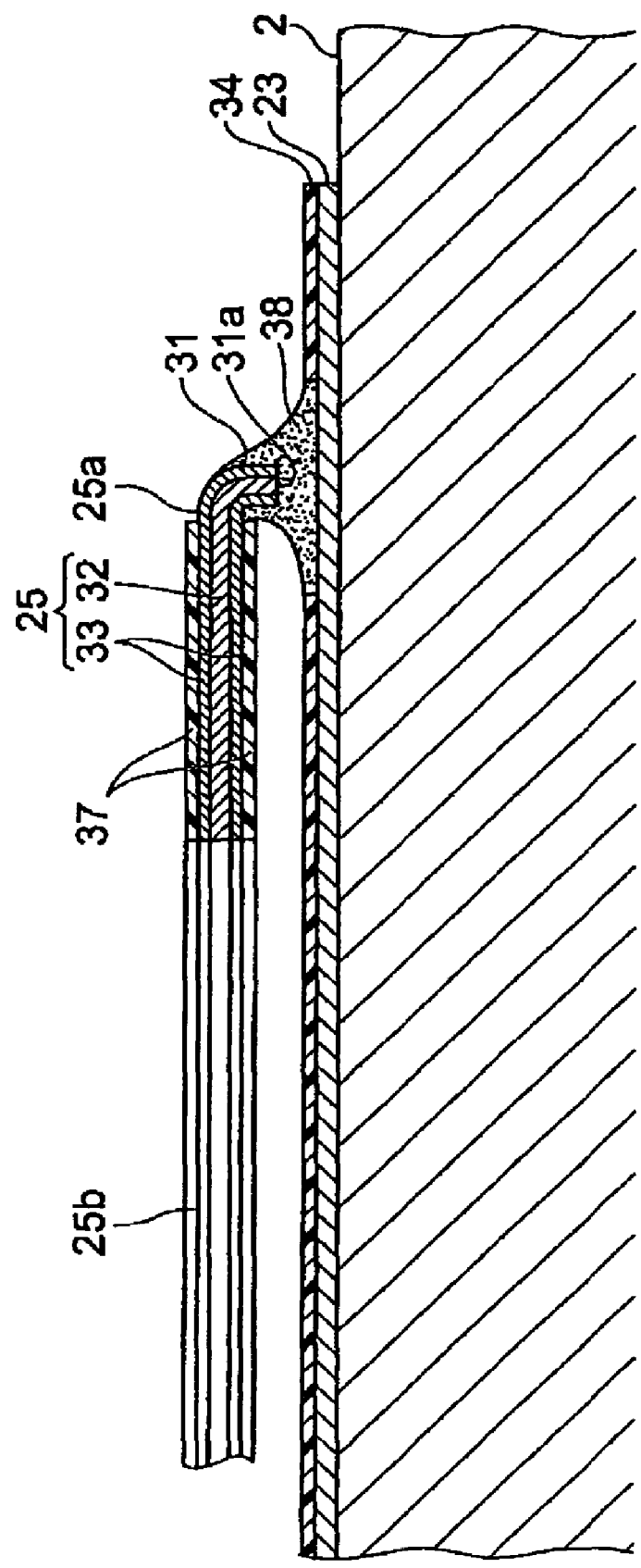
FIG. 15 is a partial sectional view along line XV-XV illustrated in FIG. 14.

As shown in FIGS. 14 and 15, the second external electrode 25 has a metal plate 32, and tin-plated layers 33 provided on the inside surface and on the outside surface of metal plate 32. The second external electrode 25 is constructed in a flat plate shape. The projections 31 are formed by bending parts of the first portions 25a in the second external electrode 25 toward the first external electrode 23. The tips 31a of the respective projections 31 are substantially located on the same plane.

A solder layer 38 is provided on a portion opposite to each projection 31 of the second external electrode 25, on the outside surface of the first external electrode 23. A resist layer 34 is provided on the region except for the solder layers 38. Resist layers 37 are provided on the inside surface of the inside tin-plated layer 33 and on the outside surface of the outside tin-plated layer 33, except for the projections 31 on the second external electrode 25.

The first external electrode 23 and the second external electrode 25 are soldered by reflow in a state in which the solder layer 38 and the tip 31a of the projection 31 butt against each other at each projection 31 of the second external electrode 25. This results in electrically and physically connecting the second external electrode 25 to the first external electrode 23 by solder at each projection 31.

In the present embodiment, with provision of the resist layers 34, 37, it is also feasible to prevent outflow of the solder melted during the reflow. This enables the first external electrode 23 and the second external electrode 25 to be securely connected by solder at each projection 31. Even if either one or both of the resist layers 34, 37 are absent, it is feasible to adequately connect the first external electrode 23 and the second external electrode 25 by solder at each projection 31. Instead of the solder layer 38, the first external electrode 23 and the second external electrode 25 may be connected with an electroconductive adhesive or the like at each projection 31.

In the third and fourth embodiments, the second external electrode 25 may also be one extending in a triangular wave pattern along the stack direction, as shown in FIG. 7. The second external electrode 25 may also be one extending in a sinusoidal wave pattern along the stack direction, as shown in FIG. 8.

In the multilayer piezoelectric element 1 of the fourth embodiment described above, as in the aforementioned multilayer piezoelectric element 1 of the third embodiment, it is feasible to suppress the inhibition of displacement of the multilayer body 2 and the occurrence of disconnection of the external electrodes 21 by the simple configuration. In the multilayer piezoelectric element 1 of the fourth embodiment, it is also feasible to securely achieve the connection between the first external electrode 23 and the second external electrode 25.

It is noted that the present invention is by no means limited to the first to fourth embodiments described above. For example, the shape of the multilayer body 2 may be a circular cylinder shape, without having to be limited to the polygonal shapes. The side faces on which the external electrodes 21 are provided in the multilayer body 2 are not limited to two side faces located opposite each other, but may be two adjacent side faces. In a case where the multilayer body 2 is of a circular cylinder shape, the external electrodes 21 are provided in arbitrary regions on the side face so that they are kept apart from each other.

The first internal electrodes 11 may be exposed in the second side face 2b if they are electrically isolated from the external electrode 21 provided on the second side face 2b. Likewise, the second internal electrodes 13 may be exposed in the first side face 2a if they are electrically isolated from the external electrode 21 provided on the first side face 2a.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A multilayer piezoelectric element comprising:
a multilayer body consisting of an alternate stack of a plurality of piezoelectric members and a plurality of internal electrodes;
a first external electrode provided on a side face of the multilayer body and electrically connected to predetermined ones of said internal electrodes; and
a second external electrode of substantially planar plate shape provided outside the first external electrode and extending in a wave pattern along a stack direction of the multilayer body,
wherein the first external electrode and the second external electrode are electrically and physically connected through a plurality of connections, and
wherein the first external electrode and the second external electrode are electrically and physically connected by solder at the connections, and a solder insulating layer is formed on at least one of an outside surface of the first external electrode and an inside surface of the second external electrode, except for at least portions where the connections are located.

2. The multilayer piezoelectric element according to claim 1, wherein the connections are linearly located on the second external electrode.

3. The multilayer piezoelectric element according to claim 2, wherein the connections are located in central areas between adjacent top portions in the second external electrode.

4. The multilayer piezoelectric element according to claim 1, wherein the connections are located in a staggered pattern on the second external electrode.

5. The multilayer piezoelectric element according to claim 4, wherein the connections are located at top portions of the second external electrode.

6. The multilayer piezoelectric element according to claim 1, wherein the second external electrode extends in a rectangular wave pattern along the stack direction.

7. The multilayer piezoelectric element according to claim 6, wherein the connections are located at first portions along the stack direction in the second external electrode.

8. The multilayer piezoelectric element according to claim 6, wherein the connections are located at second portions along a direction intersecting with the stack direction in the second external electrode.

9. A multilayer piezoelectric element comprising:
a multilayer body consisting of an alternate stack of a plurality of piezoelectric members and a plurality of internal electrodes;
a first external electrode provided on a side face of the multilayer body and electrically connected to predetermined ones of the internal electrodes; and
a second external electrode arranged to overlap the first external electrode and discontinuously electrically and physically connected to the first external electrode in a stack direction of the multilayer body,
wherein the second external electrode comprises:
first portions discontinuously arranged in the stack direction, and
second potions extending in a direction intersecting with the stack direction and connecting the first portions to each other, and
wherein the first external electrode and the second external electrode are electrically and physically connected by solder at the connections, and a solder insulating layer is formed on at least one of an outside surface of the first external electrode and an inside surface of the second external electrode, except for at least portions where the connections are located.

10. The multilayer piezoelectric element according to claim 9, wherein the second external electrode is of substantially planar plate shape.

11. The multilayer piezoelectric element according to claim 9, wherein the first portions extend in the stack direction.

12. A multilayer piezoelectric element comprising:
a multilayer body consisting of an alternate stack of a plurality of piezoelectric members and a plurality of internal electrodes;
a first external electrode provided on a side face of the multilayer body and electrically connected to predetermined ones of the internal electrodes; and
a second external electrode provided outside the first external electrode and extending in a wave pattern along a stack direction of the multilayer body, the second external electrode having a substantially planar portion and a plurality of projections projecting toward the first external electrode from the substantially planar portion and being electrically and physically connected through the projections to the first external electrode.

13. The multilayer piezoelectric element according to claim 12, wherein the projections are formed by pushing portions of the second external electrode out toward the first external electrode.

14. The multilayer piezoelectric element according to claim 12, wherein the projections are formed by bending portions of the second external electrode toward the first external electrode.

15. The multilayer piezoelectric element according to claim 12, wherein tips of the respective projections are substantially located on one plane.

16. The multilayer piezoelectric element according to claim 12, wherein the second external electrode is electrically and physically connected to the first external electrode by solder at the projections.

17. The multilayer piezoelectric element according to claim 16, wherein a solder insulating layer is formed on at least one of an outside surface of the first external electrode and an inside surface of the second external electrode, except for at least the projections.

18. The multilayer piezoelectric element according to claim 12, wherein the projections are linearly located on the second external electrode.

19. The multilayer piezoelectric element according to claim 18, wherein the projections are located in central areas between adjacent top portions in the second external electrode.

20. The multilayer piezoelectric element according to claim 12, wherein the projections are located in a staggered pattern on the second external electrode.

21. The multilayer piezoelectric element according to claim 20, wherein the projections are located at top portions of the second external electrode.

22. The multilayer piezoelectric element according to claim 12, wherein the second external electrode extends in a rectangular wave pattern along the stack direction.

23. The multilayer piezoelectric element according to claim 22, wherein the projections are located at first portions along the stack direction in the second external electrode.

24. The multilayer piezoelectric element according to claim 22, wherein the projections are located at second portions along a direction intersecting with the stack direction in the second external electrode.

* * * * *